(12) United States Patent
Yariv

(10) Patent No.: US 6,359,574 B1
(45) Date of Patent: Mar. 19, 2002

(54) METHOD FOR IDENTIFYING LONGEST COMMON SUBSTRINGS

(75) Inventor: Shalom Yariv, Bet Shemesh (IL)

(73) Assignee: Proxell Systems Ltd., Shimshon (IL)

( * ) Notice: Subject to any disclaimer, the term of this patent is extended or adjusted under 35 U.S.C. 154(b) by 0 days.

(21) Appl. No.: 09/821,054

(22) Filed: Mar. 30, 2001

Related U.S. Application Data
(60) Provisional application No. 60/262,654, filed on Jan. 22, 2001.

(51) Int. Cl.$^7$ ................................................ H03M 7/00
(52) U.S. Cl. ........................................... 341/50; 341/51
(58) Field of Search ............................. 341/50, 51, 87, 341/107, 86, 63, 95, 106; 708/210, 203

(56) References Cited

U.S. PATENT DOCUMENTS

| | | | | |
|---|---|---|---|---|
| 5,978,795 A | * | 11/1999 | Poutanen et al. ............. | 707/3 |
| 6,069,573 A | * | 5/2000 | Clark, II et al. ............. | 341/50 |
| 6,121,901 A | * | 9/2000 | Welch et al. ................. | 341/51 |
| 6,191,710 B1 | * | 2/2001 | Waletzki ...................... | 341/63 |
| 6,320,522 B1 | * | 11/2001 | Satoh .......................... | 341/51 |

* cited by examiner

*Primary Examiner*—Brian Young
*Assistant Examiner*—John Nguyen
(74) *Attorney, Agent, or Firm*—AlphaPatent Associates Ltd.; Daniel J. Swirsky

(57) ABSTRACT

A method for identifying a longest common substring for a string T and a string R, including selecting a registration symbol that appears in both strings R and T, constructing a first relative distance vector R' from the appearance of the registration symbol in the string R, constructing a second relative distance vector T' from the appearance of the registration symbol in the string T, deriving a substring pair $R_{CS}$ and $T_{CS}$ in the strings R and T respectively for each common substring pair $R_{CS}$ and $T_{CS}$ in the vectors R' and T' respectively, and identifying the longest matching of the $R_{CS}$ and $T_{CS}$ substring pairs as the longest common substring for the string T and the string R.

10 Claims, 3 Drawing Sheets

METHOD FOR IDENTIFYING LONGEST COMMON SUBSTRINGS

CROSS-REFERENCE TO RELATED APPLICATIONS

This application is related to and claims priority from U.S. Provisional Patent Application No. 60/262,654, entitled "DELTA TRANSFORM STREAM PROCESSING OPTIMIZATION," filed Jan. 22, 2001, and incorporated herein by reference in its entirety.

FIELD OF INVENTION

The present invention relates to differential data compression techniques in general and in particular to methods for identifying the longest common substring of two strings.

BACKGROUND OF THE INVENTION

Compression of data has long been used for two distinct purposes, to reduce the amount of storage space required to hold data on a storage medium and to reduce the number of bits that must be sent over a communications link to transmit the data One well-known method for compression is to represent the data to be compared in teens of its differences from some reference set of data. Multiple occurrences of a given pattern wit the data to be compressed are replaced with a shorter sequence of data acting as a placeholder for the pattern. A special case of this approach is run-length encoding, which entails abbreviating repeated consecutive occurrences of a given bit pattern by a single occurrence of that pattern plus a count of the number of times the pattern is repeated Compression encoding techniques that find and encode differences between file versions are known as "delta compression" or "differential compression" techniques. Well known differential compression techniques include the Tichy Block-Move algorithm and the VDELTA algorithm, which may be though of as a combination of the Block-Move and Lempel-Ziv algorithms.

The effectiveness of a compression technique, typically expressed as a factor by which compression reduces the length of the dam often depends on the nature of the data to be compressed, and a method designed for one kind data is not, in general, as effective when applied to other kinds of data. For example, some compression methods that are quite effective when applied to text files are often far less effective when applied to video images, and vice versa. In one technique well-suited for text compression, a target string or symbol sequence on a first computer is compared to a reference string or symbol sequence to identify the longest common substring (LCS) of symbols which are common to both symbol sequences. A sting v is a substring of a string u if u=u'vu" for some prefix u' and suffix u". The target symbol sequence may be reconstructed at a second computer by transmitting a representation of the target symbol sequence including indices identifying the LCS and other substrings unique to the target symbol sequence, rather than transmitting the target symbol sequence itself provided that the second computer also has a copy of the same reference symbol sequence.

The two main challenges facing LCS-based differential compression techniques have been finding an efficient method of identifying LCSs common to target and reference symbol sequences and finding an efficient method of representing the target symbol sequence in terms of LCSs and unique substrings. Unfortunately, LCS techniques known in the art generally apply a generic, byte-by-byte comparison in a single processing thread and with little or no regard to certain file characteristics that might otherwise reduce the number of comparison required The following U.S. Patents are believed to be representative of the current state of the art of differential data compression methods and apparatus: U.S. Pat. Nos. 5,850,565, 5,977,889, 6,012,063, and 6,104,323.

SUMMARY OF THE INVENTION

The present invention provides a novel method for identifying the LCS of a target symbol sequence and a reference symbol sequence such as may be used in support of differential data compression.

In one aspect of the present invention a method for identifying a longest common substring for a string T and a string R is provided including selecting a registration symbol that appears in both strings R ad T, constructing a first relative distance vector R' from the appearance of the registration symbol in the string R, constructing a second relative distance vector T' from the appearance of the registration symbol in the string T, deriving a substring pair $R_{CS}$ and $T_{CS}$ in the strings R and T respectively for each common substring pair $R'_{CS}$ and $T'_{CS}$ in the vectors R' and T' respectively, and identifying the longest matching of the $R_{CS}$ and $T_{CS}$ substring pairs as the longest common substring for the string T and the string R.

In another aspect of the present invention the selecting step includes selecting the registration symbol from a group of symbols that appear in either of the strings R and T an average number of times as compared with all other symbols that appear in either of the strings R and T.

In another aspect of the present invention the selecting step includes selecting the most randomly distributed symbol among the group of symbols as the registration symbol.

In another aspect of the present invention the selecting step includes selecting the registration symbol from a group of symbols that appear in either of the strings R and T within a predefined tolerance of an average number of times as compared with all other symbols that appear in either of the strings R and T.

In another aspect of the present invention the selecting step includes selecting the most randomly distributed symbol among the group of symbols as the registration symbol.

In another aspect of the present invention the constructing steps include constructing the first vector R' from the position value of the first appearance of the registration symbol in the string R, and thereafter from the relative distance values between subsequent appearances of the registration symbol in the string R, and constructing the second vector T' from the position value of the first appearance of the registration symbol in the string T, and thereafter from the relative distance values between subsequent appearances of the registration symbol in the string T.

In another aspect of the present invention the deriving step includes identifying the common substring pair $R'_{CS}$ and $T'_{CS}$ in the vectors R' and T' respectively using an LCS technique.

In another aspect of the present invention the deriving step includes calculating the offset of $R_{CS}$ in R by summing the values in R' that precede $R'_{CS}$, calculating the offset of $T_{CS}$ in T by summing the values in T' that precede $T_{CS}$, and calculating the length of $R_{CS}$ in R and $T_{CS}$ in T by summing all the values in either of $R'_{CS}$ and $T'_{CS}$.

In another aspect of the present invention the identifying step includes correspondingly adjusting the length of any of the substring pairs $R_{CS}$ and $T_{CS}$ until a longest possible common superstring is determined for the substring pair $R_{CS}$ and $T_{CS}$.

In another aspect of the present invention the selecting step includes constructing a hash function $h_k^j = (d_k^j \mod z)$ for a string s where s is either of the strings R and T, k is a character appearing in the string s, k being a member of a character set having z possible members, $d_k$ is a vector of the relative distances between consecutive appearances of k in s, and j is an index of a single element in vector $d_k$, for each value of k in s, generating a histogram $h_k$ of the hash functions of the relative distances $d_k^j$ between appearances of k in s, where $d_k^j$ is the relative distance between consecutive appearances j and j+1 of k in s, computing the randomness $f_k$ of the distribution of each k in s as $$f_k = \frac{\sigma_k}{N_k}$$

where N is the number of appearances of k in s and σ is the standard deviation of the histogram $h_k$, and selecting the character k for which $f_k$ is minimal as the registration symbol.

It is appreciated throughout the specification and claims that the terms "string," "substring," and "symbol sequence" refer to any sequence of bits, bytes, words, or any other sequence of information coding units.

The disclosures of all patents, patent applications, and other publications mentioned in this specification and of the patents, patent applications, and other publications cited therein are hereby incorporated by reference in their entirety.

BRIEF DESCRIPTION OF THE DRAWINGS

The present invention will be understood and appreciated more fully from the following detailed description taken in conjunction with the appended drawings in which.

DETAILED DESCRIPTION OF PREFERRED EMBODIMENTS

Figure 1:
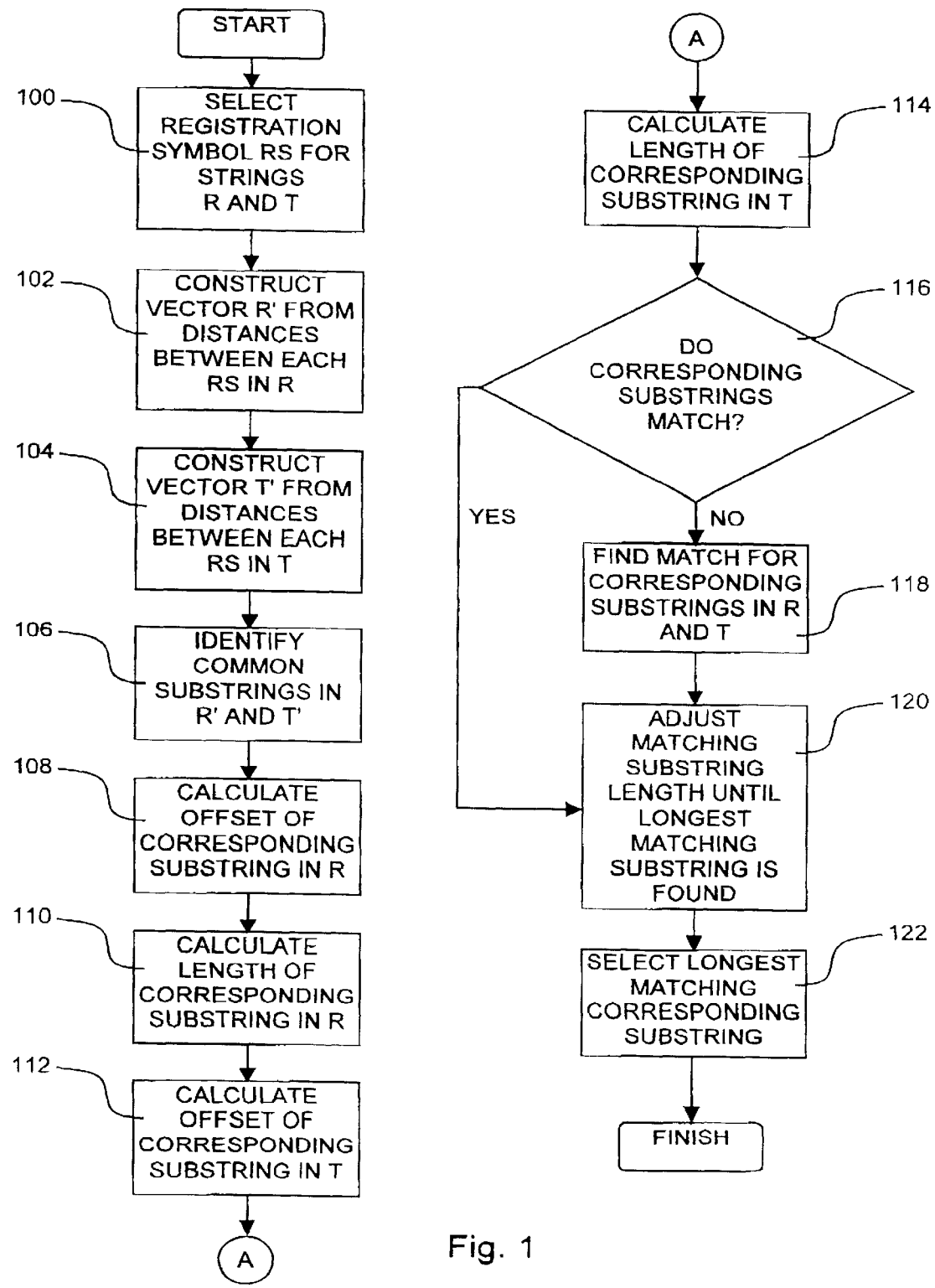
FIG. 1 is a simplified flowchart illustration of a method for identifying longest common substrings, operative in accordance with a preferred embodiment of the present invention.
Figure 2:
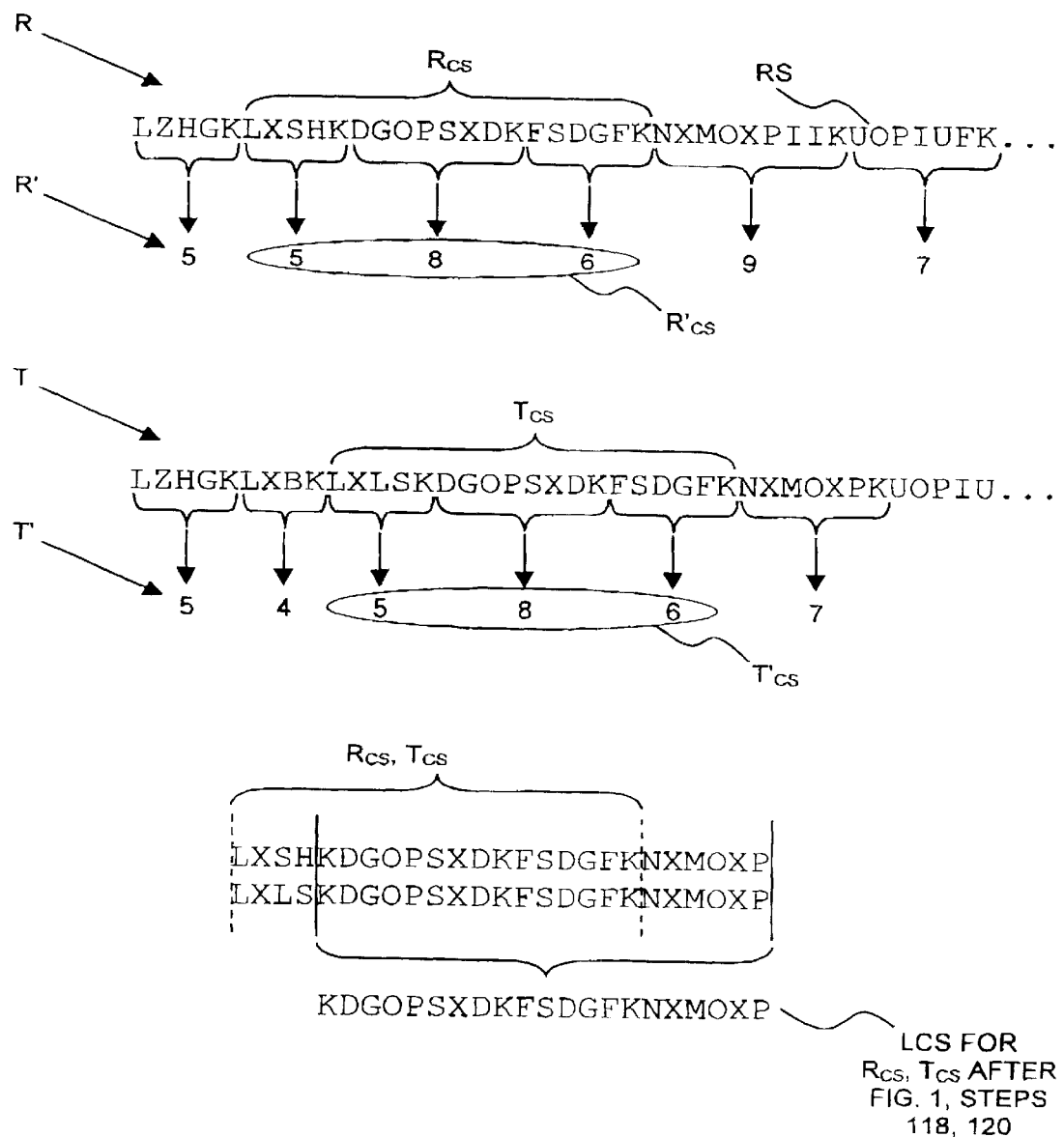
FIG. 2 is a simplified pictorial illustration useful in understanding the method of FIG. 1.

Reference is now made to FIG. 1, which is a simplified flowchart illustration of a method for identifying longest common substrings, operative in accordance with a preferred embodiment of the present invention, and additionally to FIG. 2, which is a simplified pictorial illustration useful in understanding the method of FIG. 1. In the method of FIG. 1, a target string T is compared to a reference string R to identify the longest common substring (LCS) of symbols common to both R and T. Typically, strings R and T are alphanumeric text strings, with string T representing a transformation of string R, such as where string R is a word processing file which has undergone modifications to yield a modified word processing file a string T.

In the method of FIG. 1, a symbol is selected that appears in both strings R and T (step 100). Preferably, the symbol, hereinafter referred to as the "registration symbol" or RS, is:

a) selected from a group of one or more symbols that appear in string R, string T, or both, an average number of times as compared with all other symbols that appear in string R, string T, or both, or within a predefined tolerance of the average, such as ±20%; and b) is the most randomly distributed symbol among the group of symbols.

A preferred method for determining the registration symbol is described in greater detail hereinbelow with reference to FIG. 3.

A relative distance vector R' is constructed form the appearance of the registration symbol in string R, taking the position value of the first appearance of the registration symbol in string R, and thereafter the relative distance values between subsequent appearances of the registration symbol in string R (step 102). For example, where the reference symbol is the 5th, 10th, 18th, and 24th symbol in string R, R'={(5-0),(10-5),(18-10),(24-18)}={5, 5, 8, 6}. Likewise, a relative distance vector T' is constructed from the appearance of the registration symbol in string T, taking the position value of the first appearance of the registration symbol in string T, and thereafter the relative distance values between subsequent appearances of the registration symbol in string T (step 104). Vectors R' and T' are then compared using any known LCS technique to identify common substrings among the values of vectors R' and T' (step 106). For example, where R'={5, 5, 8, 6, 9, 7, 8, 3, 15, 6, 8, 19, 22} and T'={5, 4, 5, 8, 6, 7, 14, 9, 7, 3, 15, 6, 8, 22}, the common sub trings are {5, 8, 6}, {9, 7}, and {3, 15, 6, 8}. For each common substring pair $R'_{CS}$ and $T'_{CS}$ in R' and T' respectively, a corresponding substring $R_{CS}$ in R is derived by calculating the offset of $R_{CS}$, such as by summing the values in R' that precede $R'_{CS}$, or by setting the offset equal to 0 or 1 (depending on the offset indexing scheme used) where no values precede $R'_{CS}$ (step 108). The length of $R_{CS}$ in R is also calculated, such as by summing all the values in $R'_{CS}$ (step 110), Thus, in the preceding example, the values in R' that precede $R'_{CS}$ is {5}, and, therefore, the of set of common substring {5, 8, 6} in R is Σ{5}=5 where the first character in R has an offset=1. The length of {5,8,6} in R is Σ{5, 8, 6}=19. The corresponding substring $T_{CS}$ in T is determined in the same manner as $R_{CS}$ in R (steps 112, 114). Once substring pairs $R_{CS}$ and $T_{CS}$ have been determined, they are compared to each other to determine whether they match (step 116). If $R_{CS}$ and $T_{CS}$ do not match, known LCS techniques may be used to determine whether an LCS exists for $R_{CS}$ and $T_{CS}$ (step 118). If $R_{CS}$ and $T_{CS}$ match, they may be correspondingly increased in length by preceding and/or succeeding symbols in R and T respectively and compared until the longest possible common "superstring" is determined for $R_{CS}$ and $T_{CS}$ (step 120). Once steps 108–120 have been performed for all common substrings in R' and T' identified in step 106, the LCS for R and T is thus the longest common substring among all common substrings found in steps 118 and 120 (step 122).

Figure 3:
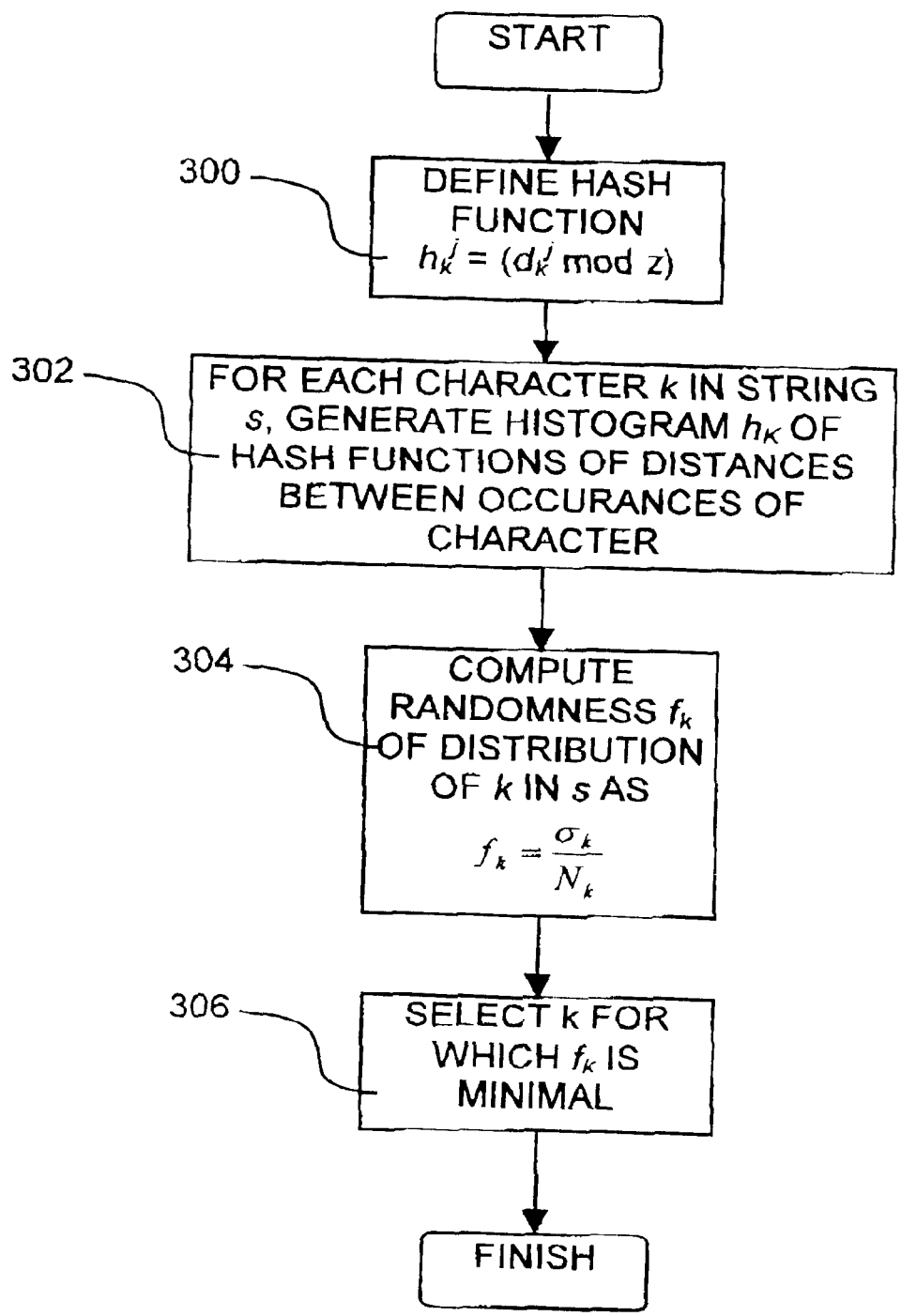
FIG. 3 is a simplified flowchart illustration of a method of selecting a registration symbol operative in accordance with a preferred embodiment of the present invention.

Reference is now made to FIG. 3, which is a simplified flowchart illustration of a method of selecting a registration symbol, operative in accordance with a preferred embodiment of the present invention. In the method of FIG. 3 a hash function $h_k^j = (d_k^j \mod z)$ is defined for a string s (step 300) where s is one of the input strings, R or T, or alternatively a concatenation of both R and T; k is a character appearing in string s, with k typically being expressed in terms of its character set index value (e.g., from 0 to 255 in the ASCII character set) where the character set has z possible members; $d_k$ is the vector of the relative distances between consecutive appearances of k in s; and j is an index of a single element in vector $d_k$. For each value of k (i.e., for each possible character in s), generate a histogram $h_k$ of the hash functions of the relative distances $d_k^j$ between appearances of k in s, where $d_k^j$ is the relative distance between consecutive appearances j and j+1 of k in s (step 302). Next, compute the randomness $f_k$ of the distribution of each k in s as $$f_k = \frac{\sigma_k}{N_k}$$

where N is the number of appearances of k in s, and σ is the standard deviation of the histogram $h_k$ (step 304). The k for which $f_k$ is minimal is then selected as the registration symbol (step 306).

It is appreciated that one or more steps of any of the methods described herein may be implemented in a different order than that shown while not departing from the spirit and scope of the invention.

While the methods and apparatus disclosed herein may or may not have been described with reference to specific hardware or software, the methods and apparatus have been described in a manner sufficient to enable persons having ordinary skill in the art to readily adapt commercially available hardware and software as may be needed to reduce any of the embodiments of the present invention to practice without undue experimentation and using conventional techniques.

While the preset invention has been described with reference to one or more specific embodiments, the description is intended to be illustrative of the invention as a whole and is not to be constructed as limiting the invention to the embodiments shown. It is appreciated that various modifications may occur to those skilled in the art that, while not specifically shown herein, are nevertheless within the true spirit and scope of the invention.

What is claimed is:

1. A method for identifying a longest common substring for a string T and a string R, the method comprising:
    selecting a registration symbol that appears in both strings R and T;
    constructing a first relative distance vector R' from the appearance of said
    registration symbol in said string R;
    constructing a second relative distance vector T' from the appearance of said registration symbol in said string T;
    deriving a substring pair $R_{CS}$ and $T_{CS}$ in said strings R and T respectively for each common substring pair $R'_{CS}$ and $T'_{CS}$ said vectors R' and T' respectively; and
    identifying the longest matching of said $R_{CS}$ and $T_{CS}$ substring pairs as the longest common substring for said string T and said string R.

2. A method according to claim 1 wherein said selecting step comprises selecting said registration symbol from a group of symbols that appear in either of said strings R and T an average number of times as compared with all other symbols that appear in either of said strings R and T.

3. A method according to claim 2 wherein said selecting step comprises selecting the most randomly distributed symbol among said group of symbols as said registration symbol.

4. A method according to claim 1 wherein said selecting step comprises selecting said registration symbol from a group of symbols that appear in either of said strings R and T within a predefined tolerance of an average number of times as compared with all other symbols that appear in either of said strings R and T.

5. A method according to claim 3 wherein said selecting step comprises selecting the most randomly distributed symbol among said group of symbols as said registration symbol.

6. A method according to claim 1 wherein said constructing steps comprise constructing said first vector R' from the position value of the first appearance of said registration symbol in said string R, and thereafter from the relative distance values between subsequent appearances of said registration symbol in said string R, and constructing said second vector T' from the position value of the first appearance of said registration symbol in said string T, and thereafter from the relative distance values between subsequent appearances of said registration symbol in said string T.

7. A method according to claim 1 wherein said deriving step comprises identifying said common substring pair $R'_{CS}$ and $T'_{CS}$ in said vectors R' and T' respectively using an LCS technique.

8. A method according to claim 1 wherein said deriving step comprises:
    calculating the offset of $R_{CS}$ in R by summing the values in R' that precede $R'_{CS}$.
    calculating the offset of $T_{CS}$ in T by summing the values in T' that precede $T'_{CS}$; and
    calculating the length of $R_{CS}$ in R and $T_{CS}$ in T by summing all the values in either of $R'_{CS}$ and $T'_{CS}$.

9. A method according to claim 1 wherein said identifying step comprises correspondingly adjusting the length of any of said substring pairs $R_{CS}$ and $T_{CS}$ until a longest possible common superstring is determined for said substring pair $R_{CS}$ and $T_{CS}$.

10. A method according to claim 1 wherein said selecting step comprises;
    constructing a hash function $h_k^j = (d_k^j \bmod z)$ for a sting s wherein s is either of said strings R and T, k is a character appearing in said string s, k being a member of a character set having z possible members, $d_k$ is a vector of the relative distances between consecutive appearances of k in s; and j is an index of a single element in vector $d_k$;
    for each value of k in s, generating a histogram $h_k$ of the hash fictions of the relative distances $d_k^j$ between appearances of k in s, where $d_k^j$ is the relative distance between consecutive appearances j and j+1 of k in s;
    computing the randomness $f_k$ of the distribution of each k in s as $$f_k = \frac{\sigma_k}{N_k}$$

where N is the number of appearances of k in s and τ is the standard deviation of the histogram $h_k$; and
    selecting the character k for which $f_k$ is minimal as said registration symbol.

* * * * *